(12) United States Patent
Tokuyama et al.

(10) Patent No.: US 12,513,826 B2
(45) Date of Patent: Dec. 30, 2025

(54) POWER SEMICONDUCTOR DEVICE

(71) Applicant: HITACHI ASTEMO, LTD., Hitachinaka (JP)

(72) Inventors: Takeshi Tokuyama, Tokyo (JP); Takahiro Araki, Tokyo (JP); Shigehisa Aoyagi, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 299 days.

(21) Appl. No.: 18/268,364

(22) PCT Filed: Sep. 30, 2021

(86) PCT No.: PCT/JP2021/036262
§ 371 (c)(1),
(2) Date: Jun. 20, 2023

(87) PCT Pub. No.: WO2022/145097
PCT Pub. Date: Jul. 7, 2022

(65) Prior Publication Data
US 2024/0040702 A1 Feb. 1, 2024

(30) Foreign Application Priority Data
Dec. 28, 2020 (JP) .................................. 2020-219431

(51) Int. Cl.
*H05K 1/18* (2006.01)
*H01L 23/00* (2006.01)
(Continued)

(52) U.S. Cl.
CPC ............. *H05K 1/186* (2013.01); *H01L 25/18* (2013.01); *H02M 7/003* (2013.01);
(Continued)

(58) Field of Classification Search
None
See application file for complete search history.

(56) References Cited

U.S. PATENT DOCUMENTS 4,996,587 A * 2/1991 Hinrichsmeyer ....... H01L 24/49
257/676
5,811,879 A * 9/1998 Akram ................ H01L 23/3121
257/E23.125
(Continued)

FOREIGN PATENT DOCUMENTS

DE  11 2017 002 424 T5  1/2019
DE  11 2020 006 116 T5  11/2022
(Continued)

OTHER PUBLICATIONS

International Search Report of PCT/JP2021/036262 dated Dec. 14, 2021.
(Continued)

*Primary Examiner* — Nishath Yasmeen
(74) *Attorney, Agent, or Firm* — MATTINGLY & MALUR, PC

(57) ABSTRACT

A power semiconductor device includes: a circuit body having a pair of conductor parts and a power semiconductor element sandwiched between the pair of conductor parts; a substrate in which a through hole is formed; and a sealing material that seals at least a part of each of the circuit body and the substrate, in which the circuit body is inserted into the through hole and has first and second exposed surfaces exposed from the sealing material, and the substrate has, in the through hole, a first protrusion and a second protrusion that protrude toward a center of the through hole and are connected to the circuit body, the first protrusion and the second protrusion being formed at positions opposed to each other in the through hole, and at least one of the first
(Continued)

protrusion and the second protrusion being a terminal that transmits power to the power semiconductor element.

4 Claims, 13 Drawing Sheets

(51) Int. Cl.
*H01L 23/495* (2006.01)
*H01L 25/18* (2023.01)
*H02M 7/00* (2006.01)
*H02M 7/537* (2006.01)

(52) U.S. Cl.
CPC ........ *H01L 23/49524* (2013.01); *H01L 24/40* (2013.01); *H01L 2224/40225* (2013.01); *H02M 7/537* (2013.01); *H05K 2201/09072* (2013.01); *H05K 2201/10166* (2013.01); *H05K 2201/10174* (2013.01); *H05K 2201/10787* (2013.01); *H05K 2201/10901* (2013.01); *H05K 2201/10931* (2013.01); *H05K 2201/10946* (2013.01)

(56) References Cited

U.S. PATENT DOCUMENTS

| | | | | |
|---|---|---|---|---|
| 5,882,957 A * | 3/1999 | Lin | ................... | H01L 23/49816 257/E23.101 |
| 6,093,970 A * | 7/2000 | Ohsawa | ................... | H01L 24/50 257/668 |
| 6,271,586 B1 * | 8/2001 | Shen | ................. | H01L 23/49575 257/784 |
| 6,429,535 B2 * | 8/2002 | Shen | ................. | H01L 23/49575 257/784 |
| 6,552,419 B2 * | 4/2003 | Toyosawa | ............... | H01L 24/48 257/668 |
| 6,717,248 B2 * | 4/2004 | Shin | ....................... | H01L 21/568 257/E23.179 |
| 7,550,842 B2 * | 6/2009 | Khandros | ........... | H01L 23/4951 257/734 |
| 9,887,167 B1 * | 2/2018 | Lee | ....................... | H01L 21/4882 |
| 9,935,090 B2 * | 4/2018 | Yu | ........................... | H01L 24/96 |
| 2016/0293563 A1 * | 10/2016 | Fujino | ..................... | H01L 23/24 |
| 2018/0359849 A1 | 12/2018 | Tanaka et al. | | |
| 2019/0143434 A1 | 5/2019 | Yoneda et al. | | |
| 2023/0119278 A1 | 4/2023 | Tsuyuno et al. | | |

FOREIGN PATENT DOCUMENTS

| | | |
|---|---|---|
| JP | 06-084732 U | 12/1994 |
| JP | 2001-268748 A | 9/2001 |
| JP | 2011-233824 A | 11/2011 |
| JP | 2013-157485 A | 8/2013 |
| JP | 5445562 B2 | 3/2014 |
| JP | 2017-212290 A | 11/2017 |
| JP | 2018-067596 A | 4/2018 |
| JP | 2018-207073 A | 12/2018 |
| JP | 2019-197842 A | 11/2019 |

OTHER PUBLICATIONS

Written Opinion of PCT/JP2021/036262 dated Dec. 14, 2021.
German Office Action received in corresponding German Application No. 11 2021 005 646.8 dated Sep. 23, 2025.

* cited by examiner

POWER SEMICONDUCTOR DEVICE

TECHNICAL FIELD

The present invention relates to a power semiconductor device.

BACKGROUND ART

In a power semiconductor device of a motor/inverter integrated type, reduction in size and in height in a manufacturing process has been more demanded. Therefore, technical improvement has been made every day to realize a highly productive device while meeting such a demand.

As background art of the invention of the present application, Patent Literature 1 below discloses a technique of inserting a spreader (lead) heat transfer part into a through hole of a substrate, and connecting an overhanging part of the spreader to a surface of the substrate, thereby making a thickness of a solder layer be as constant as possible to more stabilize an amount of protrusion of an electric conduction part from an opposite surface of the substrate.

CITATION LIST

Patent Literature

PTL 1: Japanese Patent No. 5445562

SUMMARY OF INVENTION

Technical Problem

In the configuration of PTL 1, it is necessary to bypass wiring inside the substrate and to wire the surface, resulting in causing a problem that the wiring extends to increase an inductance. In view of the foregoing, an object of the present invention is to provide a power semiconductor device that achieves both reduction in inductance of wiring and improvement in positioning of a lead package and a substrate.

Solution to Problem

A power semiconductor device according to the present invention includes: a circuit body having a pair of conductor parts and a power semiconductor element sandwiched between the pair of conductor parts; a substrate in which a through hole is formed; and a sealing material that seals at least a part of each of the circuit body and the substrate, in which the circuit body is inserted into the through hole and has a first exposed surface and a second exposed surface that are exposed from the sealing material, and the substrate has, in the through hole, a first protrusion and a second protrusion that protrude toward a center of the through hole and are connected to the circuit body, the first protrusion and the second protrusion being formed at positions opposed to each other in the through hole, and at least one of the first protrusion and the second protrusion being a terminal that transmits power to the power semiconductor element.

Advantageous Effects of Invention

According to the present invention, it is possible to provide a power semiconductor device that achieves both reduction in inductance of wiring and improvement in positioning between a lead package and a substrate.

DESCRIPTION OF EMBODIMENTS

Figure 1:
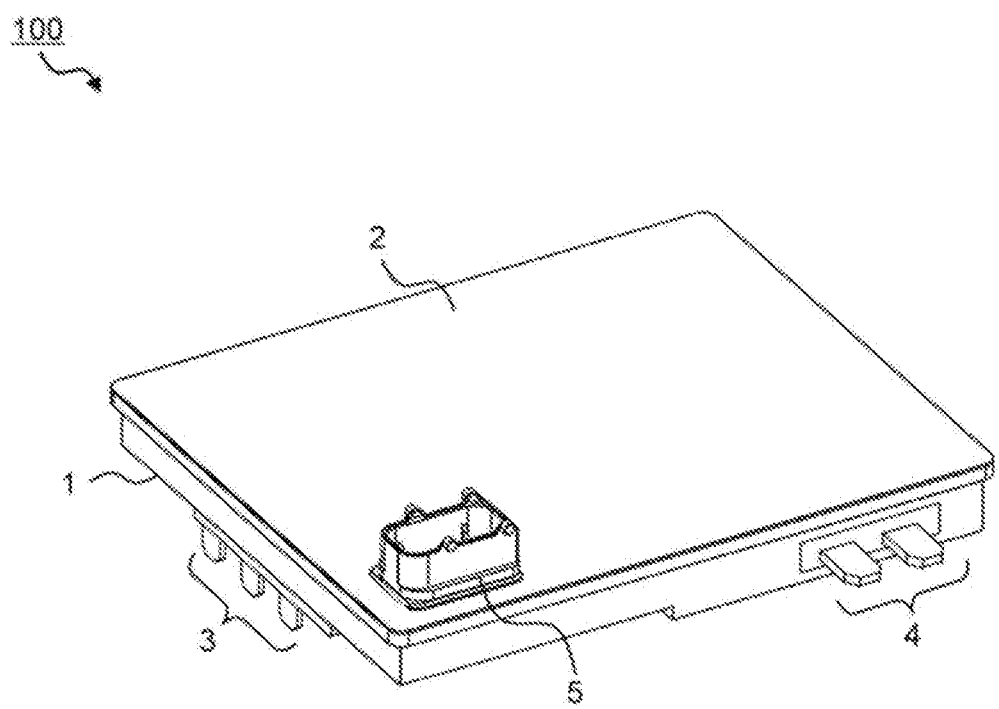
FIG. 1 is a perspective view of an entire inverter.

In the following, an embodiment of the present invention will be described with reference to the drawings. The following description and drawings are examples for describing the present invention, and are appropriately omitted and simplified for the sake of clarity of the description. The present invention can be carried out in various other forms. Unless otherwise specified, each component may be singular or plural.

Positions, sizes, shapes, ranges, and the like of the components illustrated in the drawings may not represent actual positions, sizes, shapes, ranges, and the like for the purpose of facilitating understanding of the invention. Therefore, the present invention is not necessarily limited to the position, size, shape, range, and the like disclosed in the drawings.

One Embodiment and Overall Configuration

FIG. 1 is a perspective view of an entire inverter.

In an inverter 100, a cooling water channel and components are built in a casing 1, and the built-in components are sealed by a lid body 2. From the casing 1, an alternating current connector 3 and a direct current connector 4 protrude to the outside, and furthermore, a signal connector 5 is output.

Figure 2:
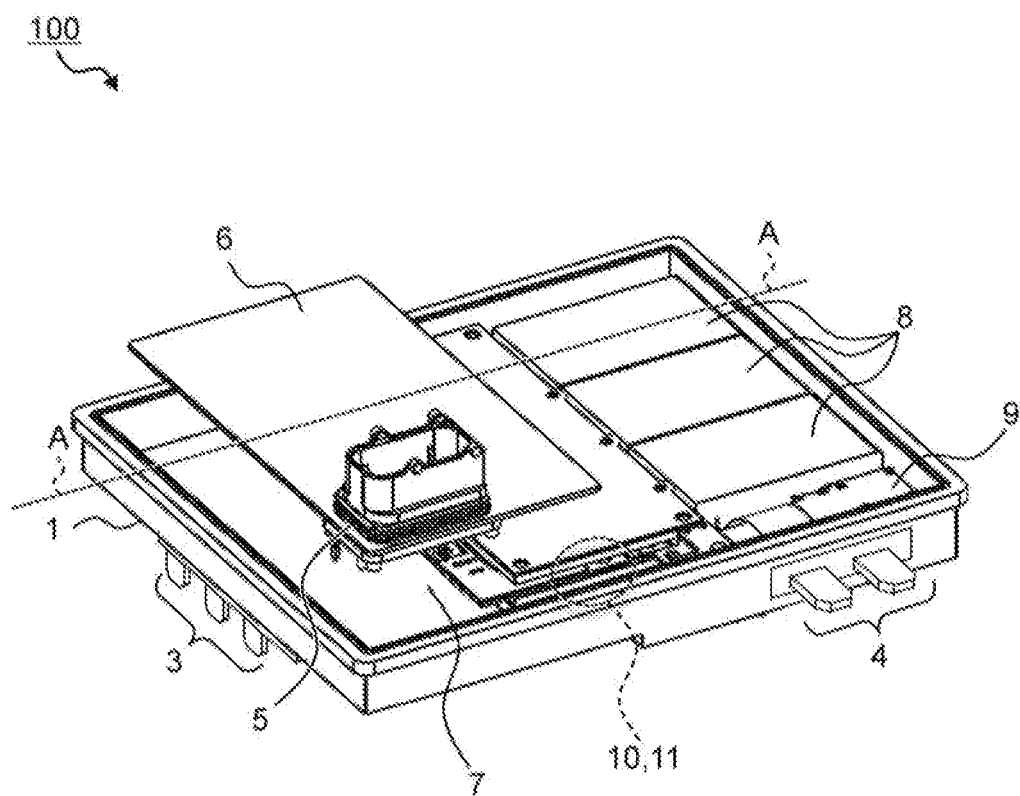
FIG. 2 is an overall perspective view of the inverter after a lid body is released.

FIG. 2 is an overall perspective view of the inverter after the lid body is released. Section line A-A is used in FIGS. 3 and 4.

Figure 6:
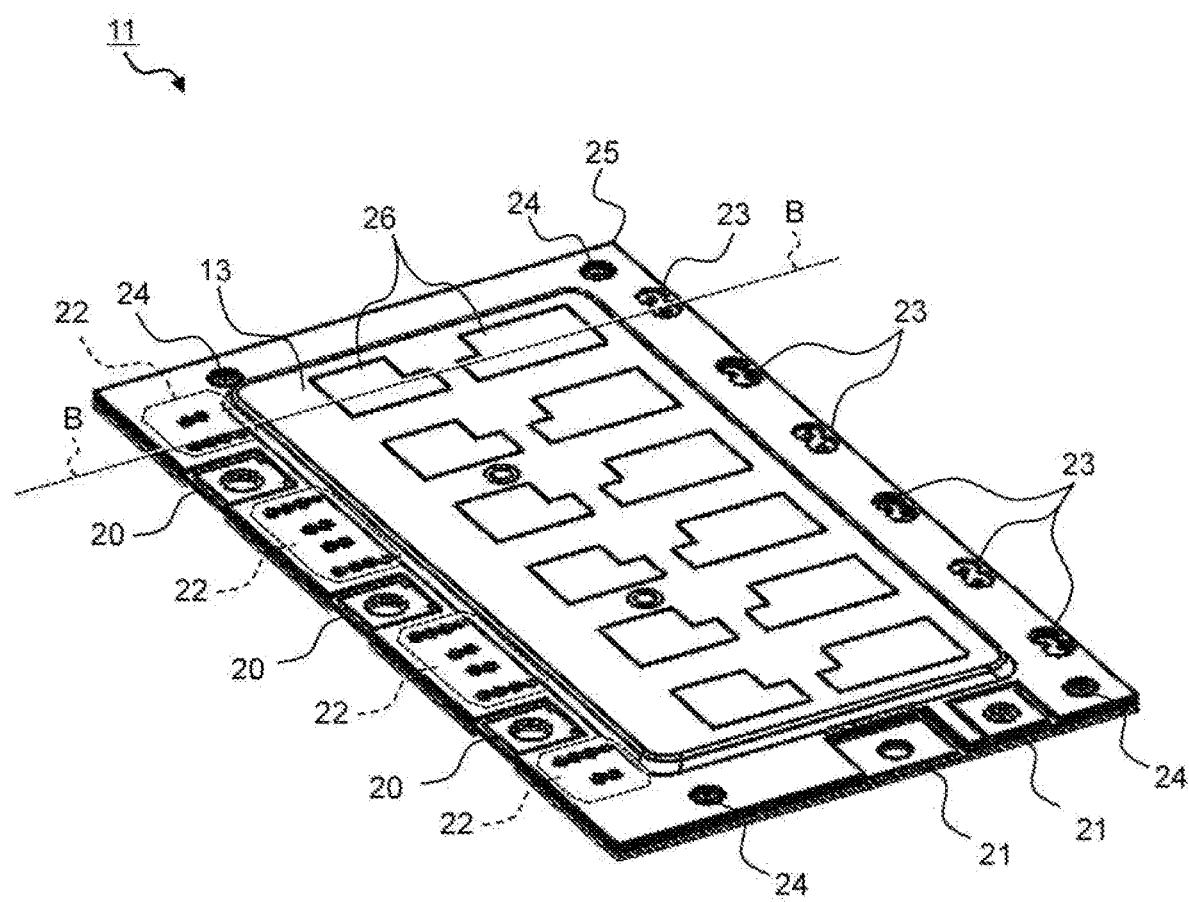
FIG. 6 is a perspective view of the main circuit unit.

In the casing of the inverter 100, there are arranged a motor control substrate 6, a gate drive substrate 7, a smoothing capacitor 8, an EMC filter 9, a cooling water channel 10, a main circuit unit 11, and a printed circuit board main circuit 25 (see FIG. 6). The motor control substrate 6 is mounted on an upper side of FIG. 2 so as to cover the gate drive substrate 7, the cooling water channel 10, and the main circuit unit 11. The signal connector 5 is mounted on the motor control substrate 6, and passes through the lid body 2 (FIG. 1) to be output to the outside.

Figure 3:
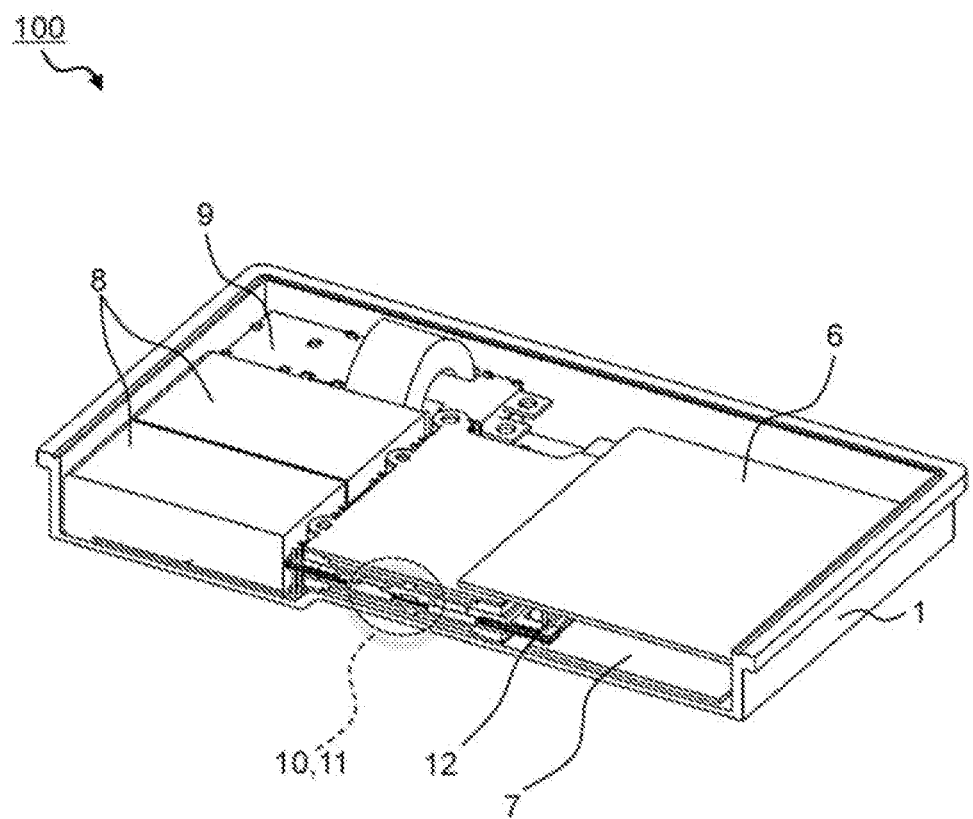
FIG. 3 is a cut perspective view of a cross section taken along line A-A of the inverter after the lid body is released.
Figure 4:
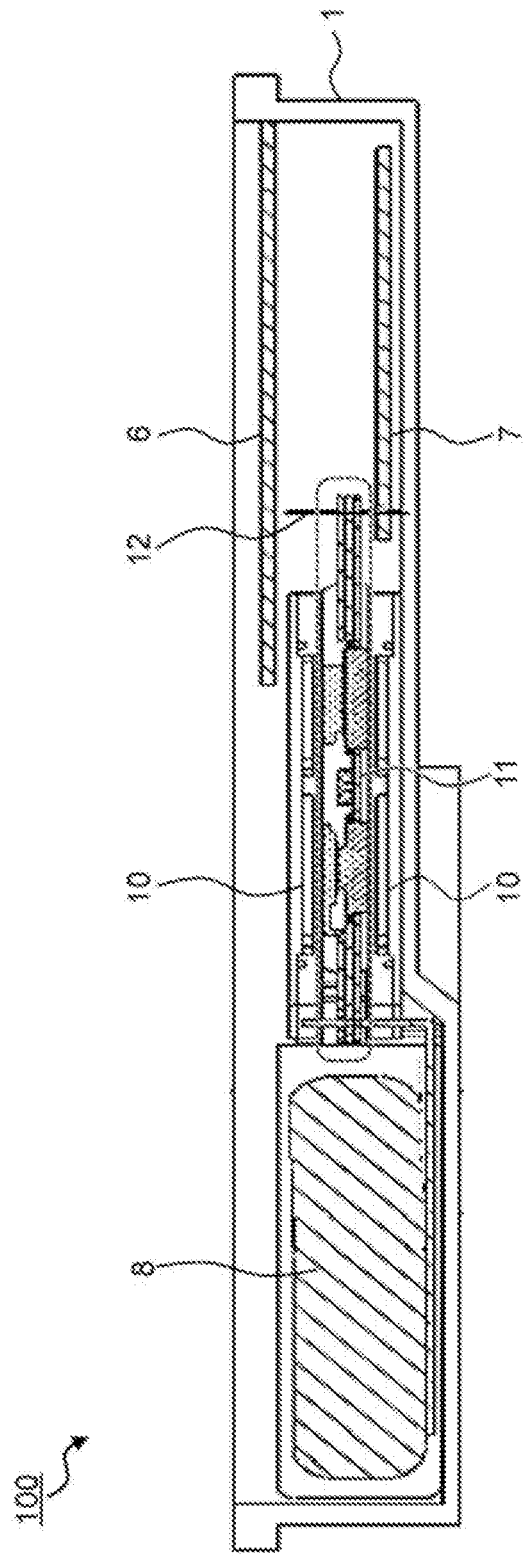
FIG. 4 is a cross-sectional view of FIG. 3.

FIG. 3 is a cut perspective view of a cross section taken along line A-A after the lid body of the inverter is released, and FIG. 4 is a cross-sectional view taken along line A-A of FIG. 2.

A substrate joining pin 12 is mounted on the gate drive substrate 7, and is electrically connected to a substrate joining through hole (see FIG. 6) of the main circuit unit 11 by a joining material such as solder. It can be seen from FIG. 4 that the main circuit unit 11 is sandwiched between the cooling water channels 10.

Figure 5:
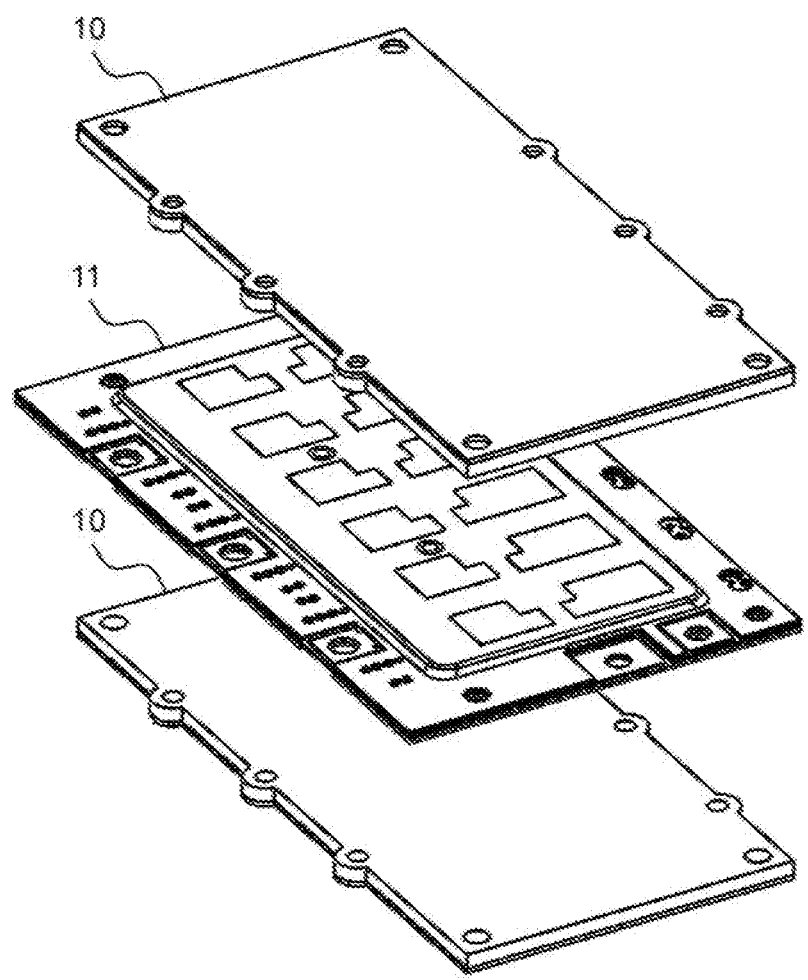
FIG. 5 is a developed view of a main circuit unit and a cooling water channel.

FIG. 5 is a developed view of the main circuit unit and the cooling water channel.

The main circuit unit 11 is sandwiched between the cooling water channels 10 and fixed. With this structure, the cooling water channel 10 cools power semiconductor elements mounted on a plurality of lead packages in the main circuit unit 11 and main circuit wiring of each part.

Figure 7:
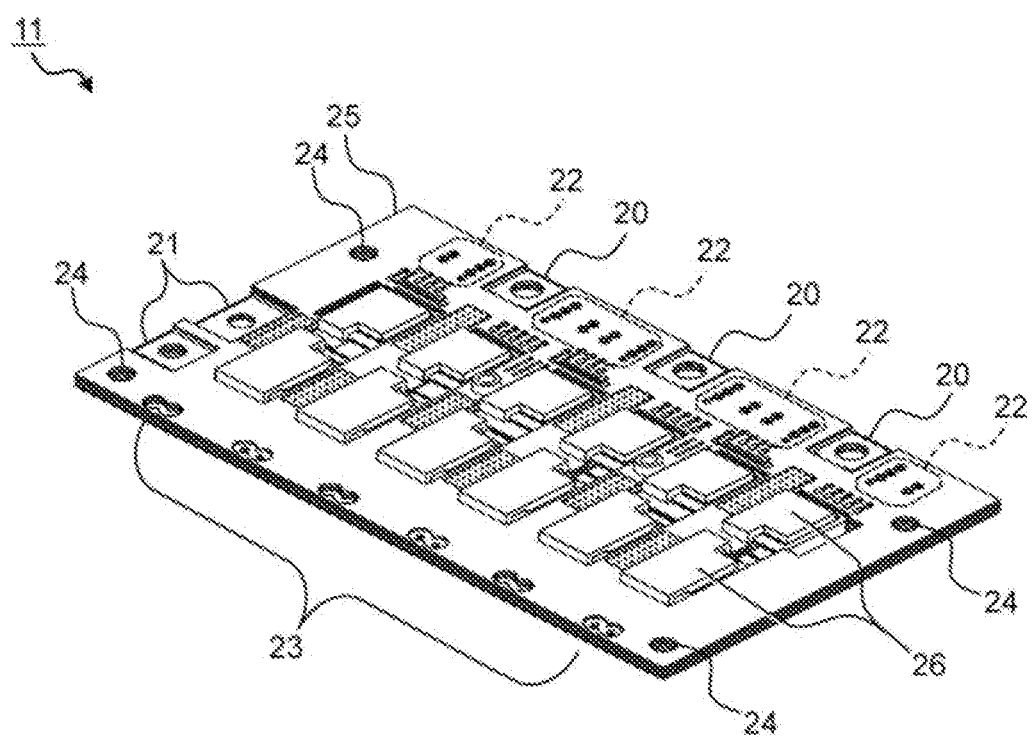
FIG. 7 is a perspective view of the main circuit unit in which a sealing resin is omitted.

FIG. 6 is a perspective view of the main circuit unit, and FIG. 7 is a perspective view of the main circuit unit in which a sealing resin is omitted.

In the main circuit unit 11, a plurality of lead packages 26 are mounted on the printed circuit board main circuit 25, all of which are molded with a sealing resin 13. An alternating current connection part 20 and a direct current connection part 21 are formed on the printed circuit board main circuit 25, and are electrically connected to an alternating current bus bar and a direct current bus bar (both not illustrated) by screw fastening.

A substrate joining through hole 22 and a capacitor joining through hole 23 are provided for a gate drive substrate and a smoothing capacitor (see FIGS. 2 and 3) to be electrically connected to each other on the printed circuit board main circuit 25 by a joining material such as solder. A fixing hole 24 is provided for connection with the cooling water channel illustrated in FIG. 5.

Figure 8:
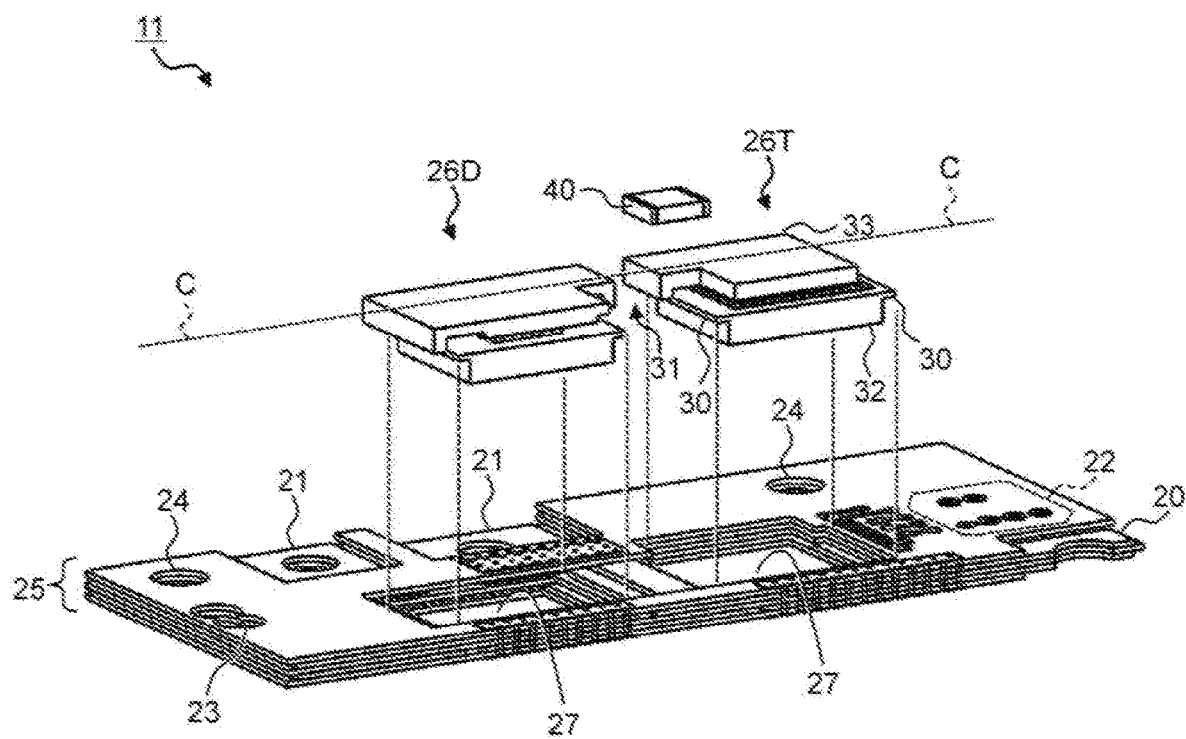
FIG. 8 is a cut perspective view of the main circuit unit according to one embodiment of the present invention in which the sealing resin is omitted.

FIG. 8 is a cut perspective view of the main circuit unit according to the embodiment of the present invention in which the sealing resin is omitted. Section line C-C is used in FIG. 10.

A diode lead package 26D and an IGBT lead package 26T, which are the lead packages 26, are inserted into through holes 27 formed in the printed circuit board main circuit 25, and have their connection terminals electrically connected to corresponding connection parts (to be described later with reference to FIG. 10) of the printed circuit board main circuit 25 by solder or the like.

A first lead frame 32 and a second lead frame 33 (common to the IGBT lead package 26T and the diode lead package 26D) of the lead package 26 sandwich electrodes on both sides of the IGBT or the diode element so as to be electrically joined.

First connection parts 30 provided at the first lead frame 32 are electrically joined to a first protrusion and a second protrusion (to be described later) provided inside the through hole 27. A second connection part 31 provided on the second lead frame 33 is connected to surface wiring of the printed circuit board main circuit 25 to form main circuit wiring. A snubber capacitor (snubber condenser) 40 is connected to positive electrode wiring and negative electrode wiring (to be described later) provided on the printed circuit board main circuit 25, and supplies a transient current at the time of switching.

Figure 9:
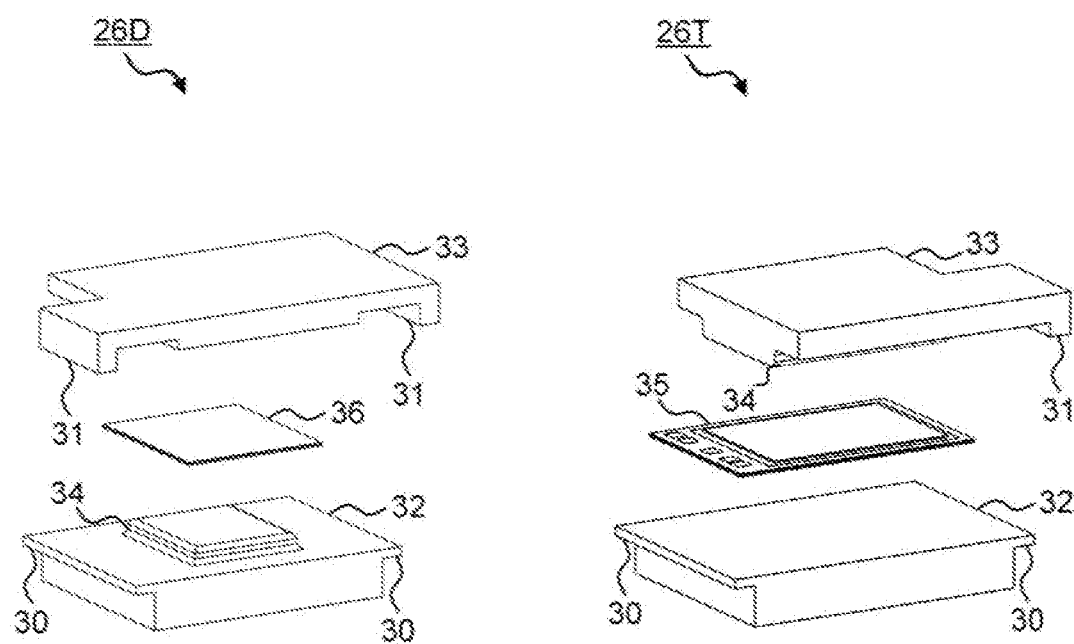
FIG. 9 is a developed perspective view of a lead package according to the embodiment of the present invention.

FIG. 9 is a developed perspective view of the lead package according to the embodiment of the present invention.

The diode lead package 26D and the IGBT lead package 26T of FIG. 9 are views obtained by developing the diode lead package 26D and the IGBT lead package 26T of FIG. 8, respectively, when viewed from the rear side of the drawing.

In the diode lead package 26D, a diode 36, and in the IGBT lead package 26T, the IGBT 35, are respectively sandwiched between the first lead frame 32 and the second lead frame 33. The first lead frame 32 is provided with the first connection parts 30 at both ends of the first lead frame 32 so as to be opposed to each other. The second lead frame 33 is provided with the second connection parts 31 having a shape protruding downward in FIG. 9.

On the first lead frame 32 in the diode lead package 26D and on the second lead frame 33 in the IGBT lead package 26T, there are provided pedestal electrodes 34 for connecting with a surface electrode of an element sandwiched between the first lead frame 32 and the second lead frame 33 while keeping an insulation distance.

Figure 10:
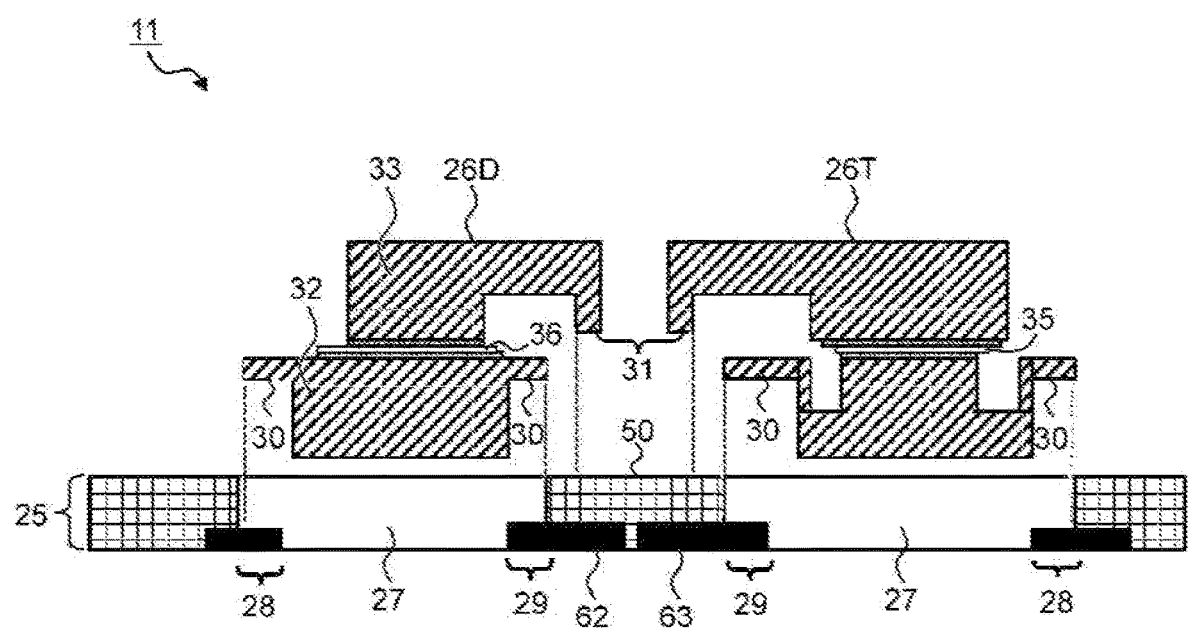
FIG. 10 is a cross-sectional view taken along line C-C in FIG. 8.

FIG. 10 is a cross-sectional view taken along line C-C in FIG. 8.

The first lead frame 32 and the second lead frame 33 which are a pair of conductors, and the IGBT 35 or the diode 36 which is a power semiconductor element sandwiched therebetween form a circuit body. In the printed circuit board main circuit 25, a first protrusion 28 and a second protrusion 29 are formed to protrude toward the center of the through hole 27 to which each circuit body is inserted, and are formed at positions opposed to each other in the through hole 27. The second protrusion 29 is a terminal electrically connected to a direct current positive electrode wiring 62 and a direct current negative electrode wiring 63.

The first connection part 30 of the first lead frame 32 and the first protrusion 28 and the second protrusion 29 in the through hole 27 are electrically connected by solder or the like. In addition, the second connection part 31 of the second lead frame 33 and a substrate surface wiring 50 are electrically connected by solder or the like. A signal pad (not illustrated) of the IGBT 35 is electrically connected to signal wiring formed on a surface of the printed circuit board main circuit 25 by wire bonding or the like.

Figure 11:
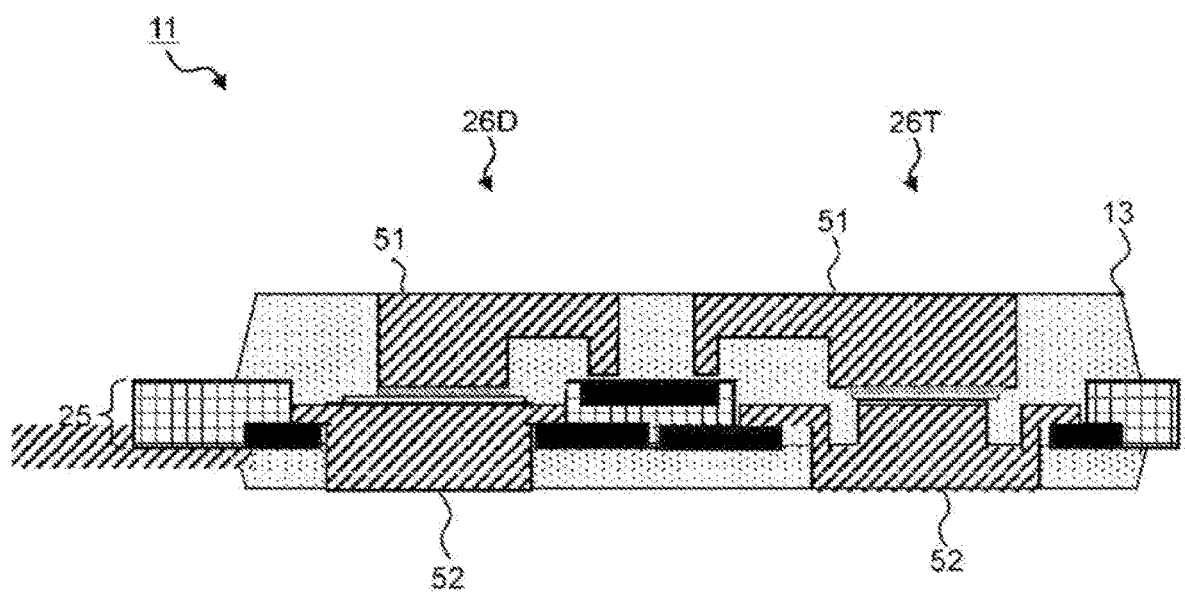
FIG. 11 is a cross-sectional view taken along line B-B in FIG. 6.

FIG. 11 is a cross-sectional view taken along line B-B in FIG. 6.

In FIG. 10, after the connection between the lead package 26 and the printed circuit board main circuit 25 is completed, the lead package 26 and the printed circuit board main circuit 25 are entirely covered and fixed with the sealing resin 13. At this time, each solder joined part is fixed with the sealing resin 13, so that a tolerance to fatigue fracture such as a crack is secured. Note that without using the sealing resin 13, the circuit body may be disposed on the substrate and fixed by being sandwiched by components from above and below, or fixed by crewing, or the like. This enables a process of molding with the sealing resin 13 to be omitted.

After the sealing with the sealing resin 13, a first exposed surface 51 and a second exposed surface 52, which are heat dissipation surfaces of the lead frames 32 and 33, respectively, are formed from a surface of the sealing resin 13. Heat generated by the IGBT and the diode is dissipated from the first exposed surface 51 and the second exposed surface 52 to the cooling water channel through an insulating layer.

With this configuration and connection, an inclination of the lead package 26 at the time of installation is improved to improve positioning, the inclination causing chip breakage at the time of transfer molding the circuit body and the entire substrate and causing resin covering of the heat dissipation surface, and furthermore, a wiring length is shortened by the connection between the protrusion provided at the substrate and the lead frame, so that an inductance is reduced.

Figure 12:
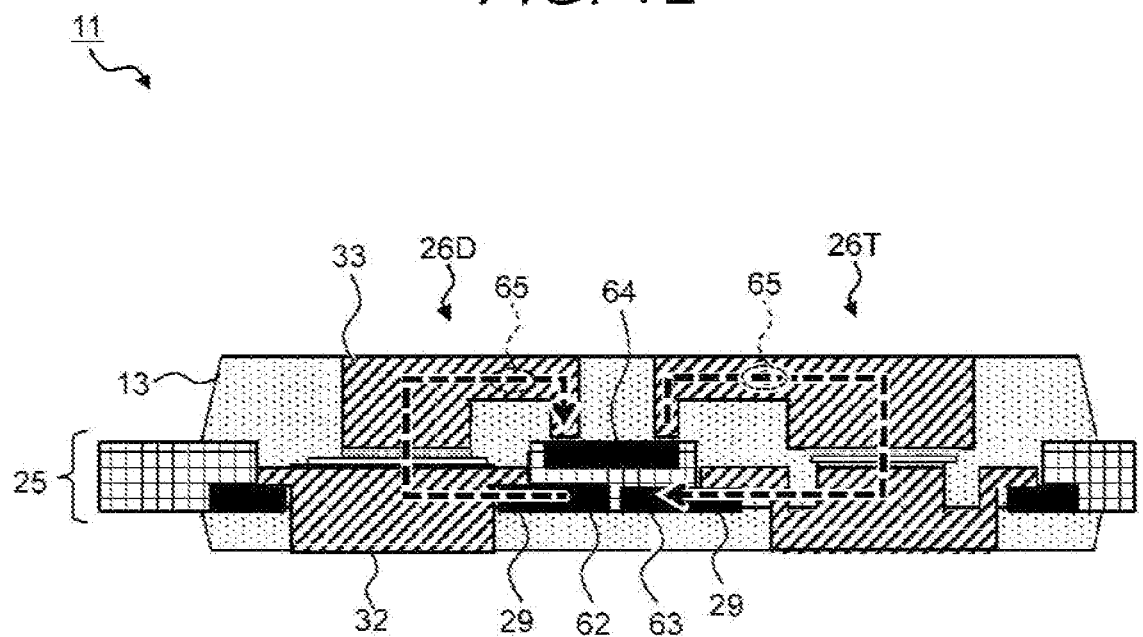
FIG. 12 is a cross-sectional view taken along line B-B in FIG. 6, illustrating a switching transient current according to the embodiment of the present invention.

FIG. 12 is a cross-sectional view taken along line B-B in FIG. 6, illustrating a switching transient current according to the embodiment of the present invention.

At the time of switching, a transient current 65 is supplied from the snubber capacitor 40 (not illustrated in FIG. 12), so that the switching transient current 65 flows to take a round from the direct current positive electrode wiring 62 on the printed circuit board main circuit 25 through the second protrusion 29 toward the direct current negative electrode wiring 63 connected to the other second protrusion via the lead packages 26D and 26T of upper and lower arm circuits, and an alternating current wiring 64.

Here, as illustrated in FIG. 10, the second lead frame 33 constituting a part of the circuit body and the second protrusion 29 formed in the through hole 27 are formed at positions opposed to each other with the printed circuit board main circuit 25 interposed therebetween. The alternating current wiring 64 built in the substrate and the second protrusion 29 are arranged to be opposed to each other inside the substrate. These arrangements provide a structure in which a magnetic field is offset by current paths in opposite directions, so that an influence of noise can be reduced.

Figure 13:
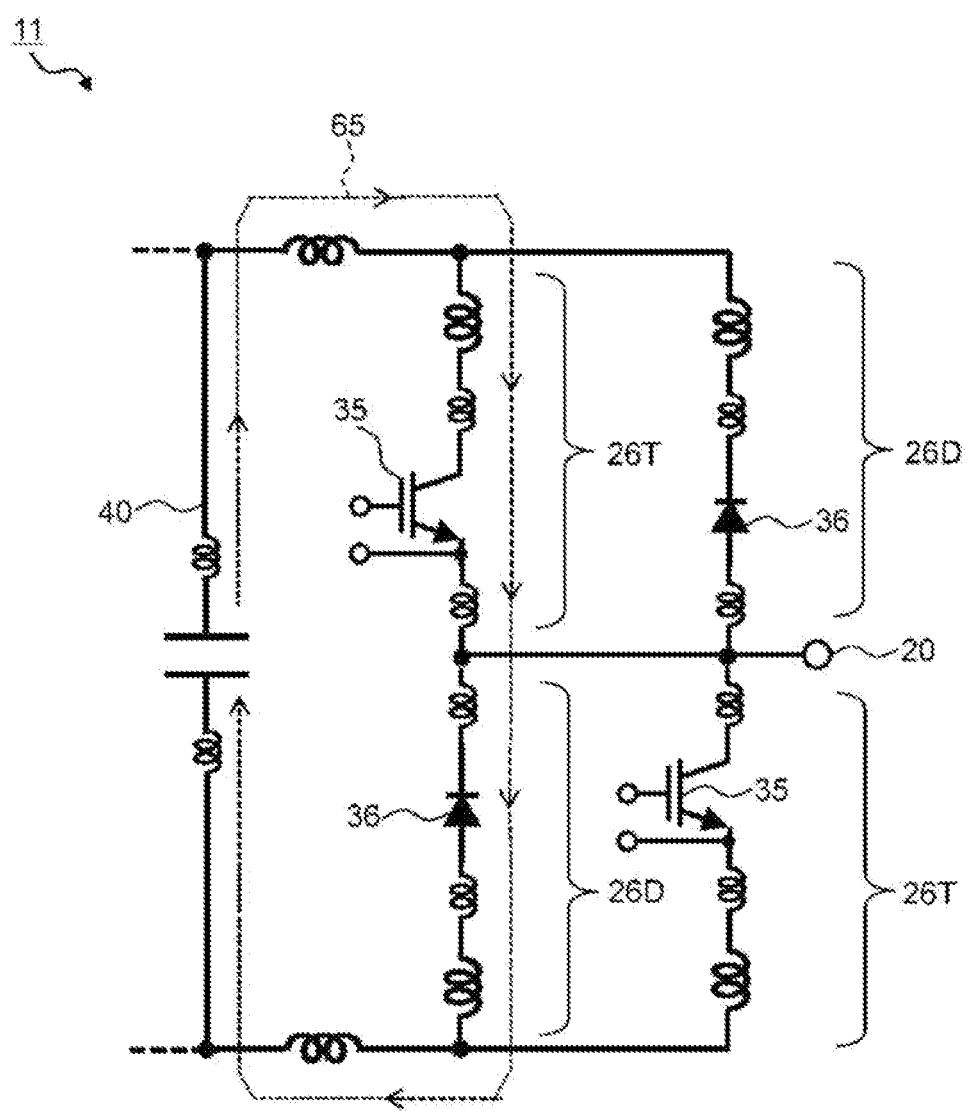
FIG. 13 is an electric circuit diagram of the inverter.

FIG. 13 is an electric circuit diagram (equivalent circuit) of the inverter.

In the equivalent circuit diagram, a path of the transient current 65 supplied from the snubber capacitor 40 at the time of switching is illustrated.

According to the embodiment of the present invention described in the foregoing, the following operations and effects are achieved.

(1) The main circuit unit 11 which is a power semiconductor device includes: the circuit body having the first lead frame 32 and the second lead frame 33 which are a pair of conductor parts, and the power semiconductor element (IGBT 35, diode 36) sandwiched between the first lead frame 32 and the second lead frame 33; the printed circuit board main circuit 25 in which the through hole 27 is formed; and the sealing resin 13 that seals at least a part of each of the circuit body and the printed circuit board main circuit 25. The circuit body is inserted into the through hole 27 and has the first exposed surface 51 and the second exposed surface 52 which are exposed from the sealing resin 13. The printed circuit board main circuit 25 has, in the through hole 27, the first protrusion 28 and the second protrusion 29 that protrude toward the center of the through hole 27 and are connected to the circuit body. The first protrusion 28 and the second protrusion 29 are formed at positions opposed to each other in the through hole 27, and at least one of the first protrusion 28 and the second protrusion 29 is a terminal that transmits power to the power semiconductor element. With this configuration, it is possible to provide a power semiconductor device that achieves both reduction in inductance of wiring and improvement in positioning between a lead package and a substrate.

(2) The second lead frame 33, and the second protrusion 29 formed in the through hole 27 are formed at positions opposed to each other with the printed circuit board main circuit 25 interposed therebetween. With this configuration, an influence of noise can be reduced by a structure in which a magnetic field is offset by a reverse current path.

(3) The alternating current wiring 64 built in the printed circuit board main circuit 25 and the second protrusion 29 are arranged to be opposed to each other in the printed circuit board main circuit 25. With this configuration, an influence of noise can be reduced.

(4) The main circuit unit 11 which is a power semiconductor device includes: the circuit body having the first lead frame 32 and the second lead frame 33 which are a pair of conductor parts, and the power semiconductor element (IGBT 35, diode 36) sandwiched between the first lead frame 32 and the second lead frame 33; and the printed circuit board main circuit 25 in which the through hole 27 is formed, and the sealing resin 13 may not be provided. Even in this case, the circuit body is inserted into the through hole 27, and the printed circuit board main circuit 25 has, in the through hole 27, the first protrusion 28 and the second protrusion 29 that protrude toward the center of the through hole 27 and are connected to the circuit body, the first protrusion 28 and the second protrusion 29 being formed at positions opposed to each other in the through hole 27, and at least one of the first protrusion 28 and the second protrusion 29 being a terminal that transmits power to the power semiconductor element. In this manner, it is possible to provide a power semiconductor device that achieves improvement in positioning without a sealing resin.

Note that the present invention is not limited to the above embodiment, and various modifications and other configurations can be combined without departing from the gist of the present invention. In addition, the present invention is not limited to one including all the configurations described in the above embodiment, and includes one in which a part of the above configurations is removed.

REFERENCE SIGNS LIST 1 casing
2 lid body
3 alternating current connector
4 direct current connector
5 signal connector
6 motor control substrate
7 gate drive substrate
8 smoothing capacitor
9 EMC filter
10 cooling water channel
11 main circuit unit
12 substrate joining pin
13 sealing resin
20 alternating current connection part
21 direct current connection part
22 substrate joining through hole
23 capacitor joining through hole
24 fixing hole
25 printed circuit board main circuit
26 lead package
26D diode lead package
26T IGBT lead package
27 through hole
28 first protrusion
29 second protrusion
30 first connection part
31 second connection part
32 first lead frame
33 second lead frame
34 pedestal electrode 35 IGBT
36 diode
40 snubber capacitor (snubber condenser)
41 IGBT element
42 diode element
50 substrate surface wiring
51 first exposed surface
52 second exposed surface
61 wiring inductance
62 direct current positive electrode wiring
63 direct current negative electrode wiring
64 alternating current wiring
65 switching transient current
100 inverter

The invention claimed is:

1. A power semiconductor device comprising:
a circuit body having a pair of conductor parts and a power semiconductor element sandwiched between the pair of conductor parts;
a substrate in which a through hole is formed; and
a sealing material that seals at least a part of each of the circuit body and the substrate,
wherein
the circuit body is inserted into the through hole and has a first exposed surface and a second exposed surface that are exposed from the sealing material, and
the substrate has, in the through hole, a first protrusion and a second protrusion that protrude toward a center of the through hole and are connected to the circuit body, the first protrusion and the second protrusion being formed at positions opposed to each other in the through hole, and at least one of the first protrusion and the second protrusion being a terminal that transmits power to the power semiconductor element.

2. The power semiconductor device according to claim 1, wherein the conductor part, and the second protrusion formed in the through hole are formed at positions opposed to each other with the substrate interposed therebetween.

3. The power semiconductor device according to claim 1, wherein alternating current wiring built in the substrate and the second protrusion are arranged to be opposed to each other in the substrate.

4. A power semiconductor device comprising:
a circuit body having a pair of conductor parts and a power semiconductor element sandwiched between the pair of conductor parts; and
a substrate in which a through hole is formed,
wherein
the circuit body is inserted into the through hole, and
the substrate has, in the through hole, a first protrusion and a second protrusion that protrude toward the center of the through hole and are connected to the circuit body, the first protrusion and the second protrusion being formed at positions opposed to each other in the through hole, and at least one of the first protrusion and the second protrusion being a terminal that transmits power to the power semiconductor element.

* * * * *